United States Patent [19]
O'Donoghue et al.

[11] Patent Number: 5,670,883
[45] Date of Patent: Sep. 23, 1997

[54] INTEGRATED CIRCUIT INTERLEVEL CONDUCTOR DEFECT CHARACTERIZATION TEST STRUCTURE AND SYSTEM

[75] Inventors: Geoff O'Donoghue, Andover; Scott C. Munroe, Carlisle, both of Mass.

[73] Assignee: Analog Devices, Inc., Norwood, Mass.

[21] Appl. No.: 560,650

[22] Filed: Nov. 20, 1995

[51] Int. Cl.$^6$ .................. H01H 31/02; G01R 31/26; H01L 21/66
[52] U.S. Cl. .................. 324/537; 324/158.1; 437/8
[58] Field of Search .................. 324/537, 158.1, 324/612; 326/136; 437/8

[56] References Cited

U.S. PATENT DOCUMENTS

| | | | |
|---|---|---|---|
| 3,859,711 | 1/1975 | McKiddy | 324/537 |
| 4,144,493 | 3/1979 | Lee | 324/765 |
| 4,672,314 | 6/1987 | Kokkas | 437/8 |
| 4,835,466 | 5/1989 | Maly | 324/537 |
| 5,049,811 | 9/1991 | Dreyer | 324/537 |
| 5,051,690 | 9/1991 | Maly | 324/537 |
| 5,326,428 | 7/1994 | Farnworth | 437/8 |

*Primary Examiner*—Ernest F. Karlsen
*Assistant Examiner*—Thomas Valone
*Attorney, Agent, or Firm*—Iandiorio & Teska

[57] ABSTRACT

An interlevel conductor defect characterization integrated circuit test structure including first and second spaced test pads, a conductor layer, an insulator layer between the conductor layer and the test pads; and a first interlevel conductor having a unit cross-sectional conductive area extending between the first test pad and the conductor layer, and a second interlevel conductor extending between said second test pad and said conductor layer and having a cross-sectional conductive area substantially greater than the unit area for detecting defects which restrict the current carrying capacity of said unit area of the first interlevel conductor but not the second interlevel conductor.

6 Claims, 7 Drawing Sheets

INTEGRATED CIRCUIT INTERLEVEL CONDUCTOR DEFECT CHARACTERIZATION TEST STRUCTURE AND SYSTEM

FIELD OF INVENTION

This invention relates to an integrated circuit interlevel conductor defect characterization test structure, and more particularly to a plurality of such test structures used in a system to determine the actual number of interlevel conductor failures.

BACKGROUND OF INVENTION

Yield prediction and yield estimation are very important considerations in integrated circuit design and process development. Models exist for predicting yield, which is the number of expected good chips on a wafer to the total number of chips on the wafer; however, the accuracy of such models depends on the accuracy of the information that describes contact and via defects. Contacts and vias are the interlevel conductors between the conduction layers of an integrated circuit (IC) chip. Contacts generally refer to those between metal layers and poly or diffusion layers. Vias refer to the interlevel conductors between metal and metal. With the increase in the complexity and number of layers in IC chips the detection of flaws in the interlevel conductors has become more important in the estimation of yield.

Presently IC chip interlevel conductor test structures employ a contact or via "chain". The chain is constructed in an IC chip with a number of independent metal sections on a first layer and a number of independent metal, poly or diffusion sections on a second layer spaced from the first layer by an insulating layer. Each section on the first layer is interconnected with a section on the second layer by an interlevel conductor so that there is a series path or "chain" from a first layer section through an interlevel conductor back to another section on the first layer and through yet another interlevel conductor to yet another sector on the second layer and so on. A measurement taken between the beginning and end of the chain indicates the resistance from one end of the chain to the other. Any rise in the normal resistance in that chain indicates a defect in one of the interlevel conductors or in the connecting sections. While this "chain" approach does indicate when there is a problem it does not distinguish between defects in the interlevel conductors and defects in the sections and there is no way to quantify the defects, e.g., how many interlevel conductors failed: one, two, one hundred. And so there is no way to quantify the yield loss due to interlevel conductor failure. Yield loss at interlevel conductors or the failure rate of interlevel conductors due to defects in the test structure is necessary to predict yield loss at interlevel conductors for other IC products.

SUMMARY OF INVENTION

It is therefore an object of this invention to provide an integrated circuit interlevel conductor defect characterization test structure and system.

It is a further object of this invention to provide such a defect characterization structure and system which enables yield rate estimation for other IC products.

It is a further object of this invention to provide such a defect characterization structure and system which enables measurement of the interlevel conductor defect rate for the technology as well.

It is a further object of this invention to provide such a defect characterization structure and system which renders a sufficiently large sample size for reliable statistical prediction.

It is a further object of this invention to provide such a defect characterization structure and system which identifies individual interlevel conductor failures.

It is a further object of this invention to provide such a defect characterization structure and system which is simpler and easier to fabricate.

It is a further object of this invention to provide such a defect characterization structure and system which can employ a single unpatterned return conductor layer.

It is a further object of this invention to provide such a defect characterization structure and system which ensures that only the defects in a standard unit cross-sectional area interlevel conductor will effect the measurement.

The invention results from the realization that a truly quantifiable measure of interlevel conductor defects in IC chips can be achieved by employing a test structure in which a test circuit is created between a pair of interlevel conductors connected in series where one such interlevel conductor is a unit cross-sectional area and the other is at least twice as large so that defects which cause a failure in the unit area interlevel conductor will not interfere with the functioning of the larger area interlevel conductor.

This invention features an interlevel conductor defect characterization integrated circuit test structure including first and second spaced test pads, a conductor layer, and an insulator layer between the conductor layer and the test pads. There are a first interlevel unit conductor having a unit cross-sectional conductive area extending between the first test pad and the conductor layer, and a second interlevel conductor extending between said second test pad and said conductor layer and having a cross-sectional conductive area substantially greater than the unit area for detecting defects which restrict the current carrying capacity of said unit area of the first interlevel conductor but not the second interlevel conductor.

In a preferred embodiment the cross-sectional area of the second interlevel conductor may be at least twice that of the unit area. The second interlevel conductor may at least partially surround the first interlevel conductor and may at all points be equidistant from the first interlevel conductor.

The invention also features an integrated circuit interlevel conductor defect quantifiable test structure system including a plurality of test structures. Each test structure may include first and second spaced test pads, a conductor layer, and an insulator layer between the conductor layer and the test pads. There may be a first interlevel conductor having a unit cross-sectional conductive area extending between the first test pad and the conductor layer, and a second interlevel conductor having a cross-sectional conductive area substantially greater than the unit area for detecting defects which restrict the current carrying capacity of the unit area of the first interlevel conductor but not the second interlevel conductor.

In a preferred embodiment the conductor layer may include a plurality of independent sections each associated with a pair of first and second test probes.

DISCLOSURE OF PREFERRED EMBODIMENT

Other objects, features and advantages will occur to those skilled in the art from the following description of a preferred embodiment and the accompanying drawings, in which.

Figure 1:
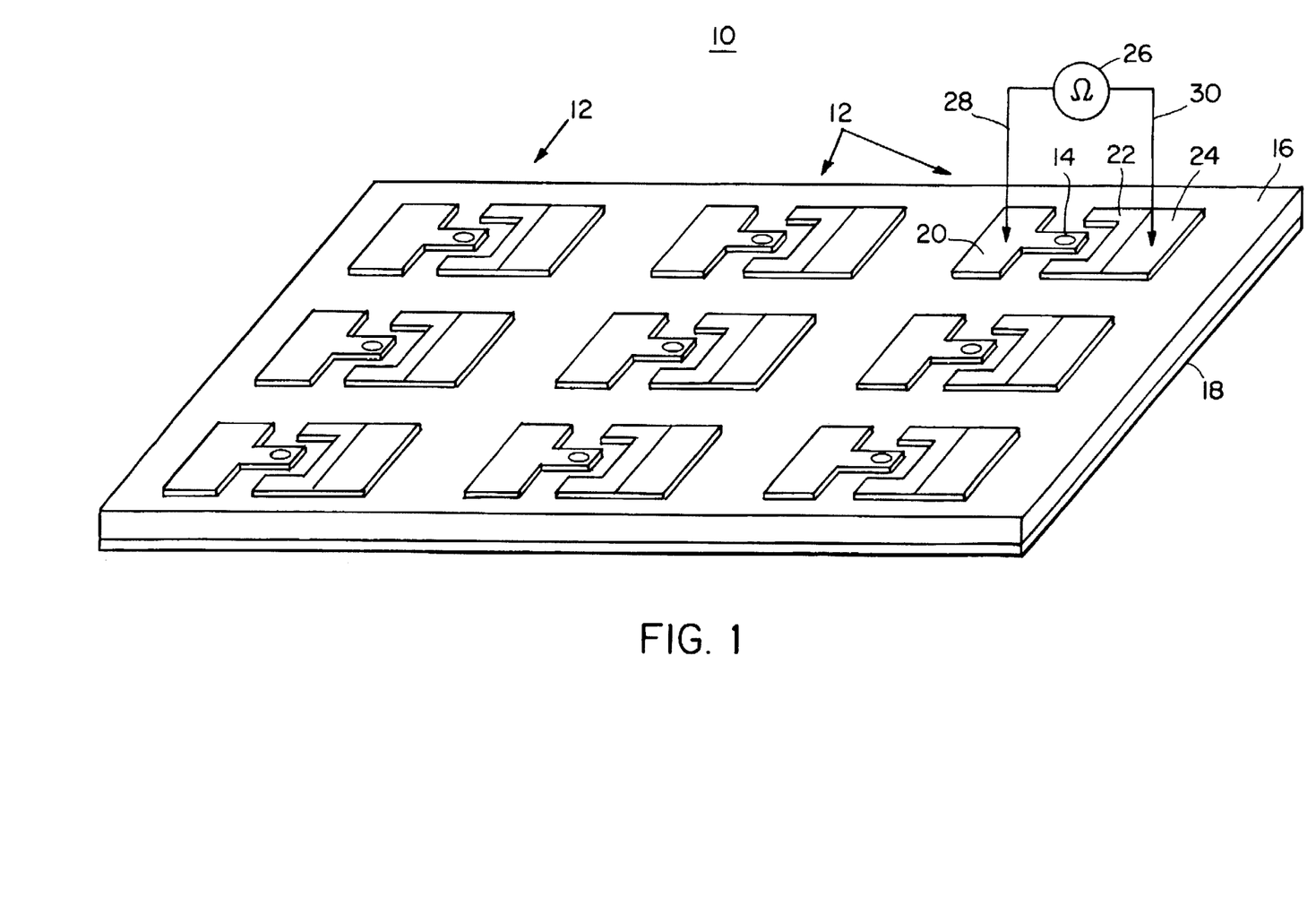
FIG. 1 is a three-dimensional view of an integrated circuit interlevel conductor defect characterization test structure system.

There is shown in FIG. 1 an integrated circuit interlevel conductor defect characterization test structure system 10 according to this invention including a plurality of individual test structures 12, each of which includes an interlevel conductor 14 formed by a plated or filled (in this example, filled) through-hole through insulating layer 16 extending to and in electrical contact with conductive layer 18. Interlevel conductor 14 is connected with contact pad 20. Surrounding interlevel conductor 14 under test is input interlevel conductor 22 which is shown as generally U-shaped. Interlevel conductor 22 also extends through insulating layer 16 and makes electrical contact with conductor layer 18. Interlevel conductor 22 is also a through-hole in the shape of a U and is filled to effect the interlevel conductor. Interlevel conductor 22 is connected to contact pad 24. A meter such as ohmmeter 26 has its probe 28 and 30 connected to pads 20 and 24, respectively, to measure the resistance in the test circuit between contact pad 24, input interlevel conductor 22, conductor layer 18, the interlevel conductor 14 under test, and contact pad 20. If it reads within a predetermined range then test structure 12 is considered to be without defect. If the measurement varies from the predetermined level then the test structure is determined to have a defect in the interlevel conductor 14 under test. With test structure 12, a reading which deviates from the expected reading indicates a failure in a particular interlevel conductor, i.e., 14, not in input interlevel conductor 22 or in any other interlevel conductor. In prior art devices, as indicated in the Background, the deviation from the nominal reading indicated only that there was a defect somewhere in the test structure system but there was no indication of where it was or how many interlevel conductors, i.e., vias or contacts were actually subject to defects.

Figure 2:
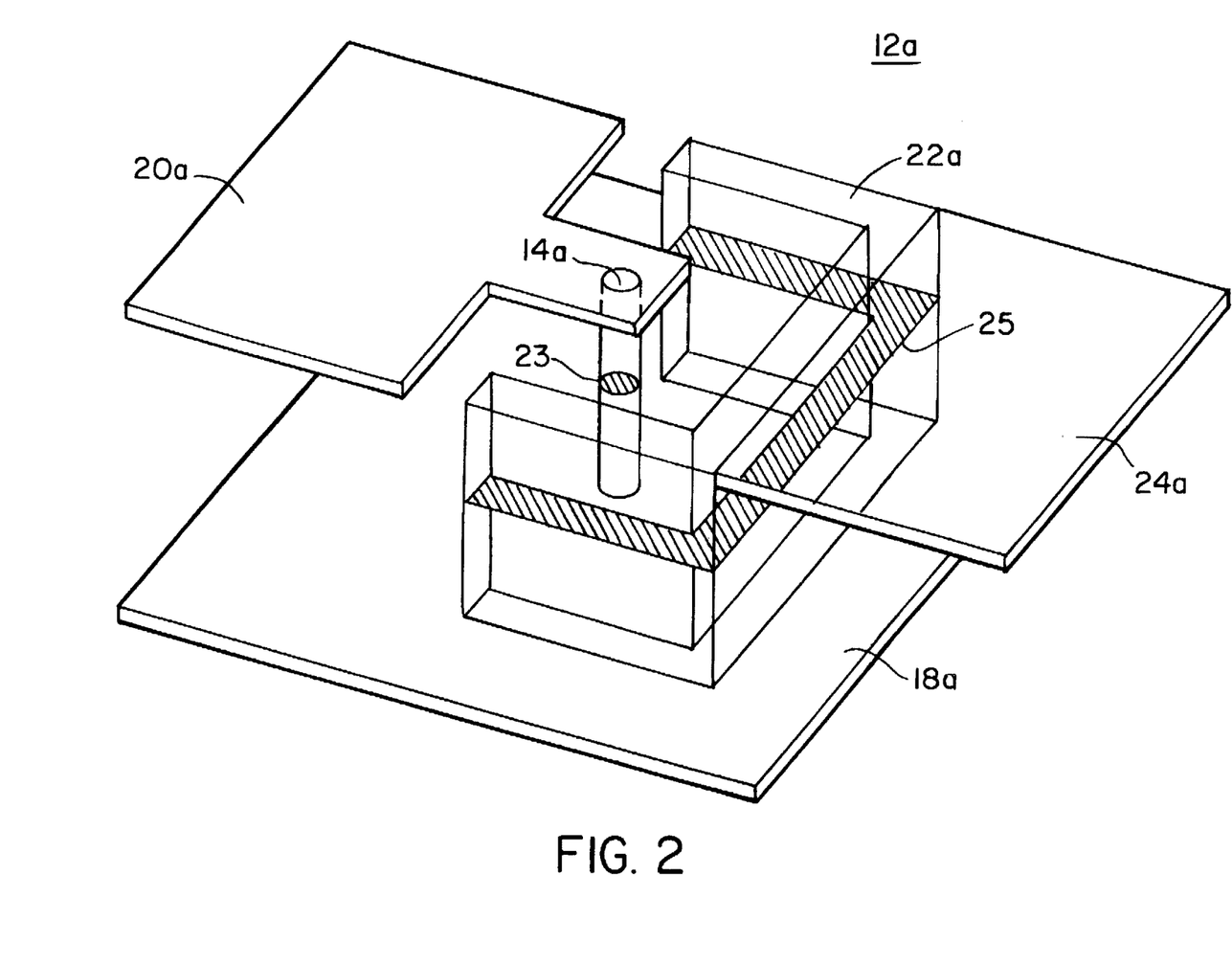
FIG. 2 is an enlarged perspective view of one of the test structures of FIG. 1.
Figure 3:
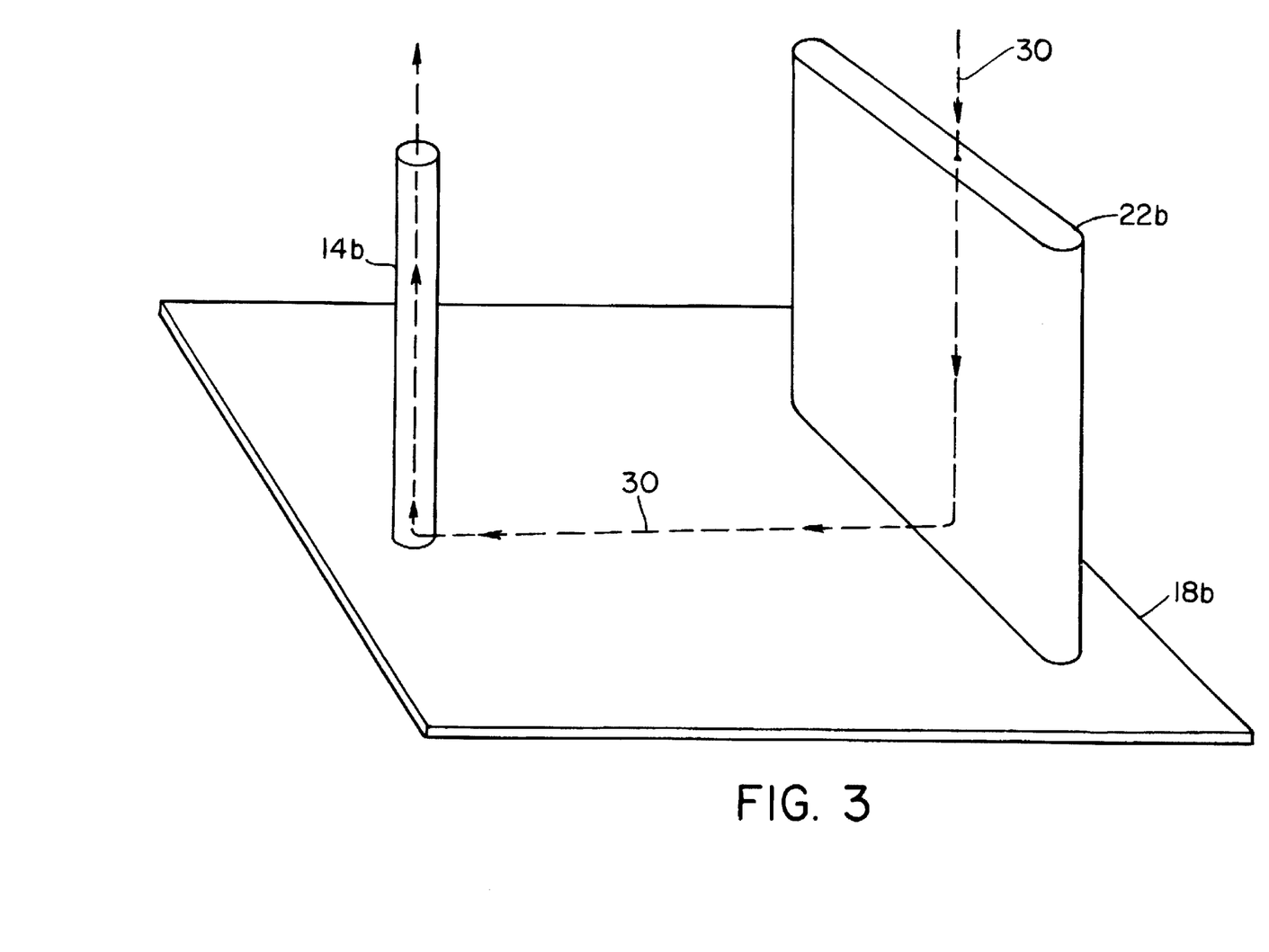
FIG. 3 is a schematic view of an integrated circuit interlevel conductor defect characterization test structure as shown in FIG. 2 illustrating the current flow through the input interlevel conductor under test in the absence of any defect.

A single test structure 12a is better visualized with reference to FIG. 2, where it can be seen that the input interlevel conductor 22a at least partially surrounds interlevel conductor 14a which is under test. For simplicity, in FIG. 2 all that is shown is the conductor material that makes up interlevel conductor 14a under test and that makes up input interlevel conductor 22a. There conductor 14a has a unit cross-sectional area 23 whereas conductor 25 has a cross-sectional area at least twice and preferably many times that of the unit cross-sectional area 23. By unit cross-sectional area is meant any selected area arbitrarily chosen as a reference and typically dictated by the technology such as the standardized contact/via size for a CMOS fabrication technology;

The operation of the test circuit as shown in FIG. 1 for a single test structure is schematically depicted in FIG. 3, where input interlevel conductor 22b is shown as a flat planar shape as opposed to the U shape of FIGS. 1 and 2. There it can be seen that current 30 introduced into input interlevel electrode 22b flows down through it and across conductor layer 18b into interlevel electrode 14b which is under test. Input interlevel electrode 22b is substantially greater in cross-sectional area than is interlevel electrode 14b. That is, it is at least twice as large in cross-sectional area and is typically an order of magnitude or even two orders of magnitude greater than the cross-sectional area of interlevel conductor 14b. If this is so then a defect which would interrupt the current flow in interlevel electrode 14b will not interrupt the current flow in input interlevel conductor 22b. In fact, preferably it will hardly be detectable. This is done so that the only defects that will be detected by the measurement will be the defects that occur in the interlevel conductor 14 under test. Thus any deviation from the nominal or expected reading must come from a defect in the interlevel conductor 14b under test and will not be contributed to by any defects that may have occurred in the input interlevel electrode 22b.

Figure 4:
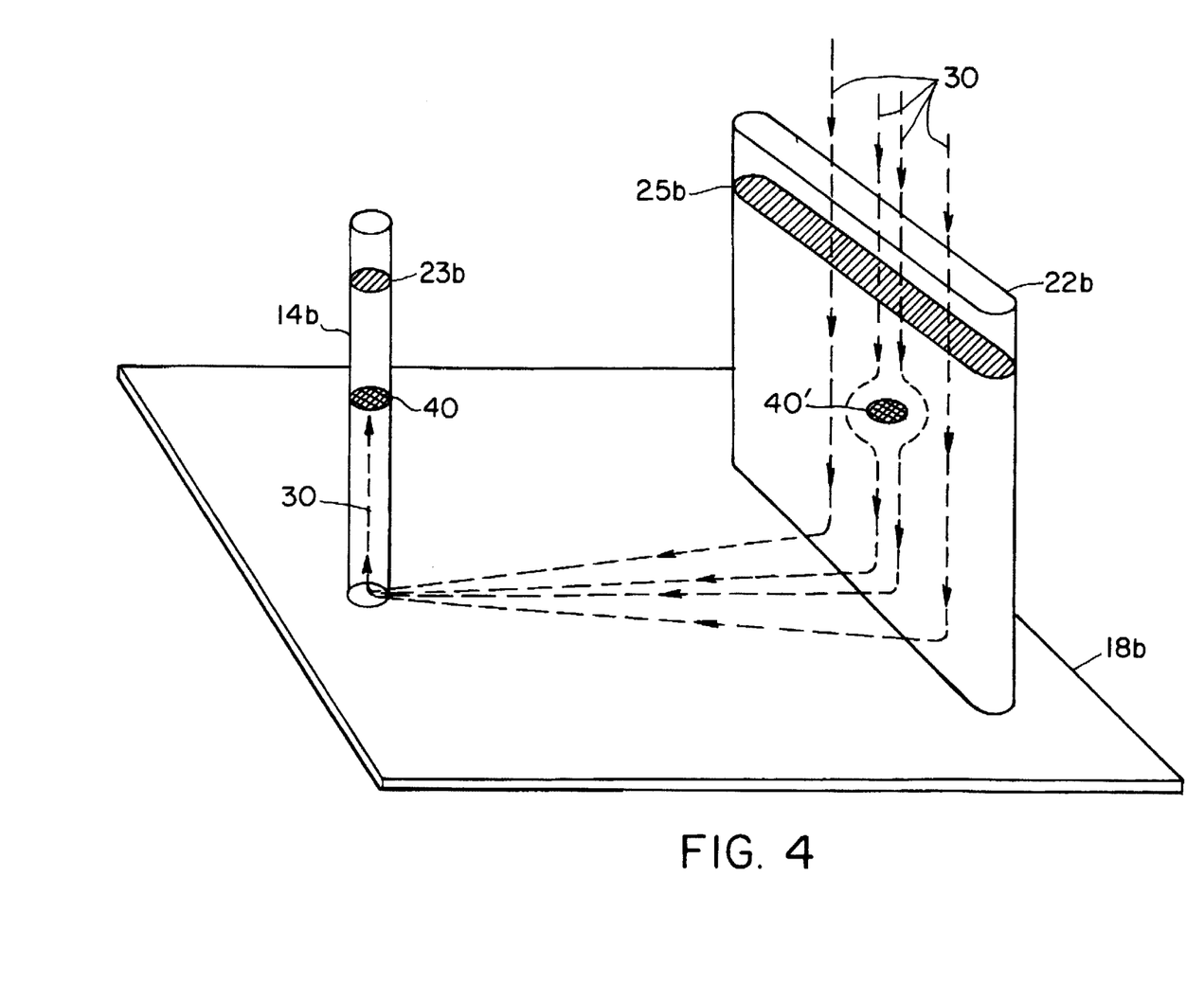
FIG. 4 is a view similar to FIG. 3 showing the redistribution of the current flow of the input interlevel conductor with a defect present.

This can be seen more clearly in FIG. 4, where a defect 40 has been introduced in interlevel electrode 14b of unit cross-sectional area under test so that the current 30 is stopped and cannot flow beyond defect 40. However, a defect of the same size 40' in input interlevel conductor 22b has virtually no effect on the current flow through conductor 22b because conductor 22b has a cross-sectional area 25b of many times the cross-sectional area 23b of conductor 14b. The current simply splits into a number of paths and distributes itself around defect 40' so that there is no significant decrease of the current or apparent increase in resistance due to the defect 40' which in interlevel electrode 14b would completely cut off the current flow.

Figure 5:
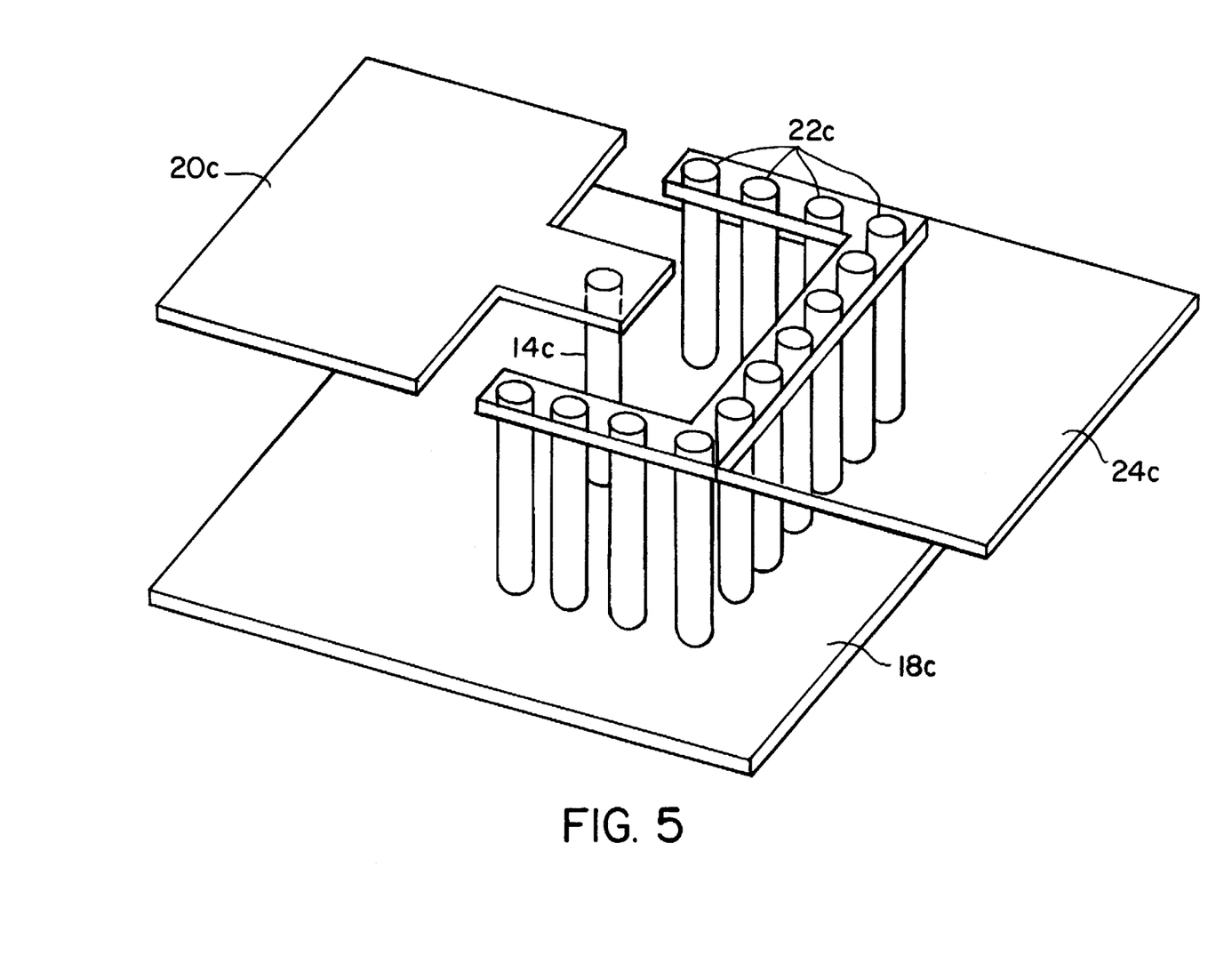
FIG. 5 is a view similar to FIG. 2 showing an alternative construction for the input interlevel conductor.

Although thus far interlevel electrode 22 has been shown as a solid U-shaped conductor, this is not necessarily so. As shown in FIG. 5, it may be a hollow conductor plated as may interlevel electrode 14 under test, and interlevel electrode 22 may be comprised of a number of individual cylindrical conductors 22c, for example, where each of those is a unit area.

Figure 6:
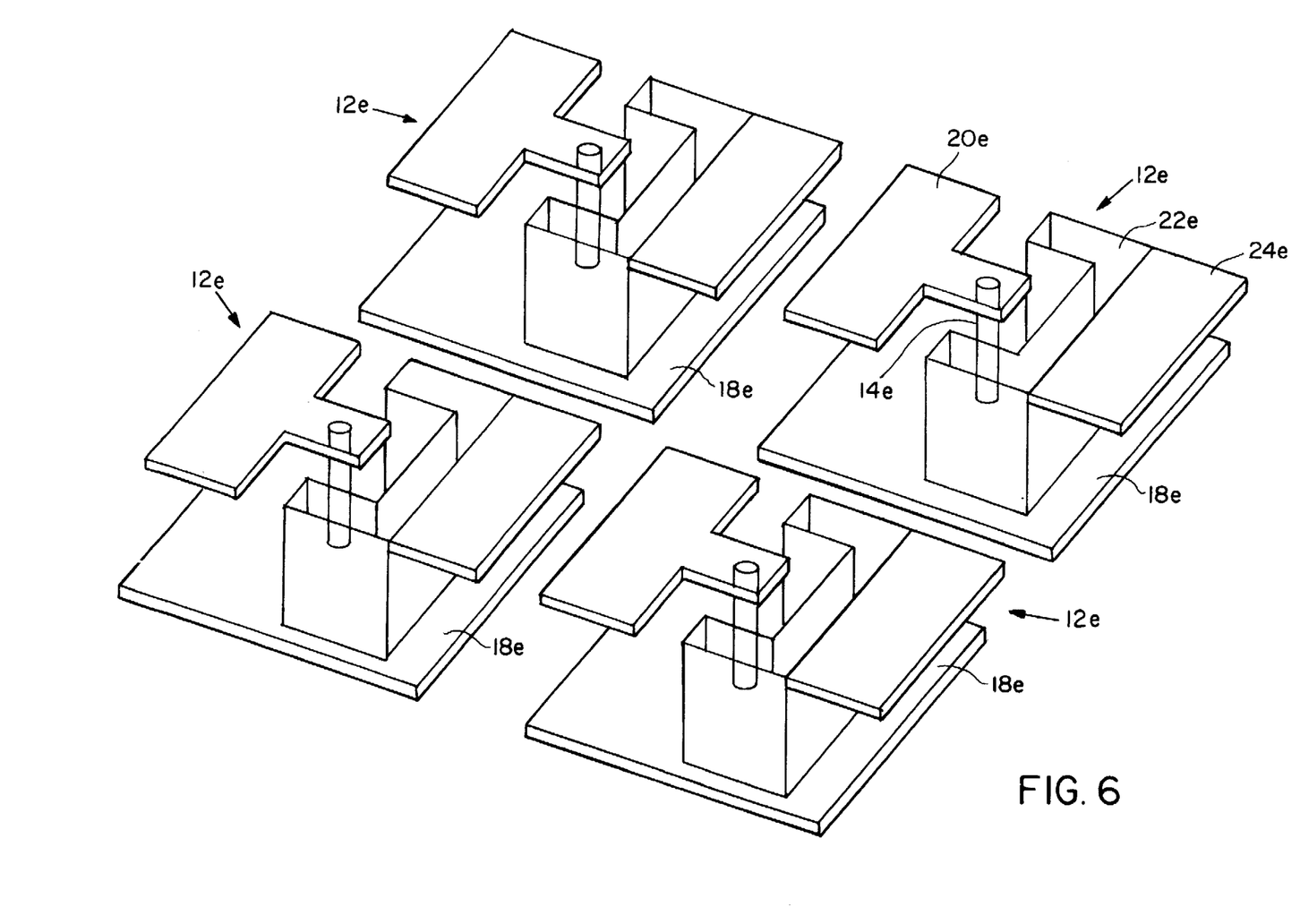
FIG. 6 is a view similar to FIG. 6 in which the conductor layer includes a plurality of conductor sections, one associated with each test structure.

Although thus far in FIG. 1 conductor layer 18 is shown as a single layer which serves all of the test structures, this is not a necessary limitation of the invention. For example, conductor layer 18d, FIG. 6, may include a plurality of conductor sections 18e, one associated with each of the test structures 12e.

Figure 7A:
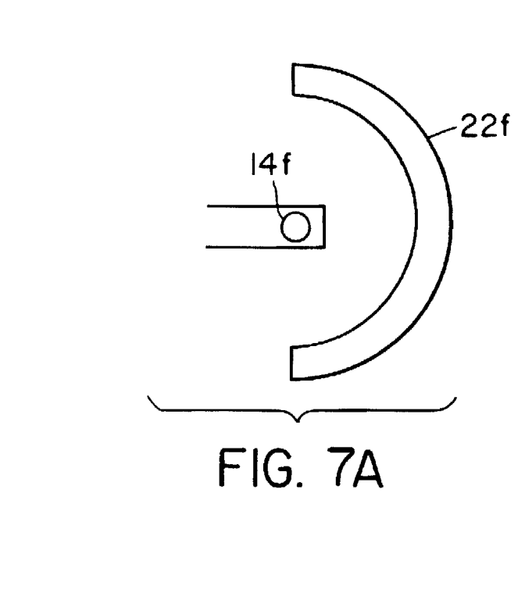
FIGS. 7A–7C are schematic illustrations of alternative forms of the input interlevel conductor and the interlevel conductor under test.
Figure 7B:
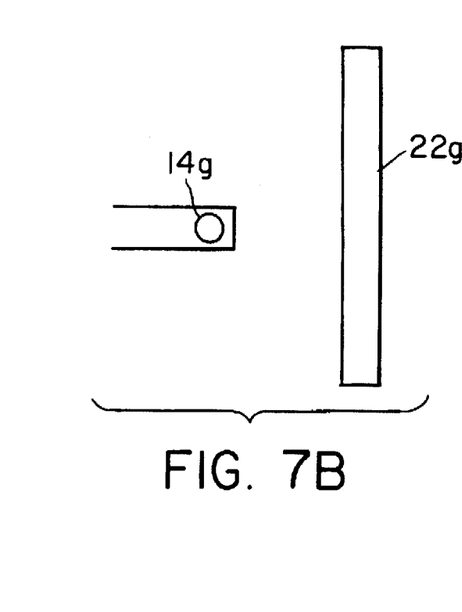
Figure 7C:
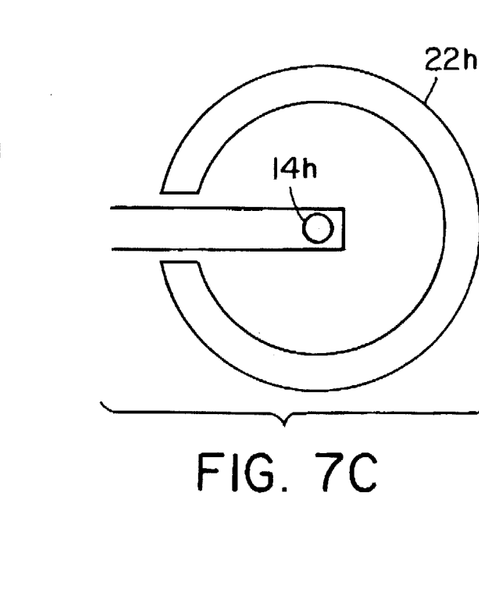

Although thus far the input interlevel conductor is shown as a U-shaped or C-shaped element, this is not a necessary limitation of the invention. For example, as shown in FIG. 7A, interlevel conductor 14f under test may be confronted with an input interlevel conductor 22f which is semicircular in shape, FIG. 7A, arranged so that every point on conductor 22f is equidistant from conductor 14f. Or, alternatively, as shown in FIG. 7B, input interlevel electrode 22g may be of flat planar [linear?] construction. Alternatively, input interlevel electrode 22h may be more nearly fully circular in shape and again may be positioned so that every point on it is equidistant from interlevel electrode 14h under test.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An interlevel conductor defect characterization integrated circuit test structure comprising:

first and second spaced test pads;

a conductor layer;

an insulator layer between said conductor layer and said test pads; and a first interlevel unit conductor having a unit cross-sectional conductive area extending between said first test pad and said conductor layer, and a second interlevel conductor extending between said second test pad and said conductor layer and having a cross-sectional conductive area substantially greater than said unit area for detecting defects which restrict the current carrying capacity of said unit area of said first interlevel conductor but not said second interlevel conductor.

2. The interlevel conductor defect characterization integrated circuit test structure of claim 1 in which said cross-sectional area of said second interlevel conductor is at least twice that of said unit area.

3. The interlevel conductor defect quantifiable integrated circuit test structure of claim 1 in which said second interlevel conductor at least partially surrounds said first interlevel conductor.

4. The interlevel conductor defect characterization integrated circuit test structure of claim 1 in which said second interlevel conductor is at all points equidistant from said first interlevel conductor.

5. An integrated circuit interlevel conductor defect characterization test structure system comprising:

a plurality of test structures each including:

first and second spaced test pads;

a conductor layer;

an insulator layer between said conductor layer and said test pads; and a first interlevel unit conductor having a unit cross-sectional conductive area extending between said first test pad and said conductor layer, and a second interlevel conductor extending between said second test pad and said conductor layer and having a cross-sectional conductive area substantially greater than said unit area for detecting defects which restrict the current carrying capacity of said unit area of said first interlevel conductor but not said second interlevel conductor.

6. The integrated circuit interlevel conductor defect quantifiable test structure of claim 5 in which said conductor substrate includes a plurality of independent sections each associated with a pair of first and second test probes.

* * * * *